United States Patent
Horikiri

(10) Patent No.: US 11,508,629 B2
(45) Date of Patent: Nov. 22, 2022

(54) NITRIDE SEMICONDUCTOR LAMINATE, METHOD FOR MANUFACTURING NITRIDE SEMICONDUCTOR LAMINATE, METHOD FOR MANUFACTURING SEMICONDUCTOR LAMINATE, AND METHOD FOR INSPECTING SEMICONDUCTOR LAMINATE

(71) Applicants: SCIOCS COMPANY LIMITED, Ibaraki (JP); SUMITOMO CHEMICAL COMPANY, LIMITED, Tokyo (JP)

(72) Inventor: Fumimasa Horikiri, Ibaraki (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 330 days.

(21) Appl. No.: 16/312,496

(22) PCT Filed: Apr. 3, 2017

(86) PCT No.: PCT/JP2017/013901
§ 371 (c)(1),
(2) Date: Dec. 21, 2018

(87) PCT Pub. No.: WO2018/003219
PCT Pub. Date: Jan. 4, 2018

(65) Prior Publication Data
US 2019/0148247 A1 May 16, 2019

(30) Foreign Application Priority Data
Jun. 27, 2016 (JP) .............................. JP2016-126579

(51) Int. Cl.
*H01L 21/205* (2006.01)
*H01L 29/812* (2006.01)
(Continued)

(52) U.S. Cl.
CPC .......... *H01L 22/12* (2013.01); *H01L 21/0254* (2013.01); *H01L 21/0262* (2013.01);
(Continued)

(58) Field of Classification Search
CPC . H01L 22/12; H01L 21/0254; H01L 21/0262; H01L 21/205; H01L 29/2003; H01L 29/778; H01L 29/812
See application file for complete search history.

(56) References Cited

U.S. PATENT DOCUMENTS

| 5,693,963 A | 12/1997 | Fujimoto et al. |
| 2003/0159362 A1* | 8/2003 | Singh ................. C09G 1/02 51/293 |

(Continued)

FOREIGN PATENT DOCUMENTS

| JP | 08-148718 A | 6/1996 |
| JP | 2005-286135 A | 10/2005 |

(Continued)

OTHER PUBLICATIONS

Fabio L. Leite et al; International Journal of Molecular Sciences, vol. 13, No. 12, pp. 12773-12856; Oct. 8, 2012, XP055361895, cXP055361895 (Year: 2012).*

(Continued)

*Primary Examiner* — Timor Karimy
(74) *Attorney, Agent, or Firm* — Pearne & Gordon, LLP

(57) ABSTRACT

There is provided a nitride semiconductor laminate, including: a substrate; an electron transit layer provided on the substrate and containing a group III nitride semiconductor; and an electron supply layer provided on the electron transit layer and containing a group III nitride semiconductor, wherein a surface force A of the electron supply layer acting as an attractive force for attracting a probe and a surface of the electron supply layer when measured using the probe
(Continued)

consisting of a glass sphere with a diameter of 1 mm covered with Cr, is stronger than a surface force B of Pt when measured under the same condition, and an absolute value |A−B| of a difference between them is 30 μN or more.

14 Claims, 8 Drawing Sheets

(51) Int. Cl.
  *H01L 21/66* (2006.01)
  *H01L 29/778* (2006.01)
  *H01L 21/02* (2006.01)
  *H01L 29/20* (2006.01)
(52) U.S. Cl.
  CPC ........ *H01L 21/205* (2013.01); *H01L 29/2003* (2013.01); *H01L 29/778* (2013.01); *H01L 29/812* (2013.01)

(56) References Cited

U.S. PATENT DOCUMENTS

| | | | |
|---|---|---|---|
| 2005/0221628 A1 | 10/2005 | Tanaka et al. | |
| 2006/0261371 A1 | 11/2006 | Kuroda et al. | |
| 2012/0025150 A1* | 2/2012 | Hersam | H01B 1/24 |
| | | | 252/511 |
| 2014/0361308 A1 | 12/2014 | Yui et al. | |
| 2016/0220727 A1* | 8/2016 | Lu | C07K 14/43509 |
| 2017/0256407 A1* | 9/2017 | Tajiri | C23C 16/301 |

FOREIGN PATENT DOCUMENTS

| | | | |
|---|---|---|---|
| JP | 2012-256704 A | | 12/2012 |
| JP | 2014-183463 | * | 9/2014 |
| JP | 2015-177152 A | | 10/2015 |

OTHER PUBLICATIONS

International Search Report for PCT/JP2017/013901 (dated Jun. 27, 2017).
Written Opinion for PCT/JP2017/013901 (dated Jun. 27, 2017).
Ohta, Hiroshi, et al., "Vertical GaN p-n Junction Diodes With High Breakdown Voltages Over 4 kV", IEEE Electron Device Letters, vol. 36, No. 11, p. 1180-1182, Nov. 2015.
Nishiguchi, Kenya, et al., "Evaluation of off-bias-stress induced surface charging at AlGaN/GaN surface using a dual-gate transistor structure", Japanese Journal of Applied Physics 53, p. 070301-1-070301-4, 2014.
Hirose, Mayumi, et al., "High temperature GaN HEMT Degradation Affected by Silicon Nitride Film Conductivity", The Papers of Technical Meeting on "Electron Devices", IEEE Japan, EDD-16-045, p. 49-53, 2016.
English Translation of the International Preliminary Report on Patentability and Written Opinion for PCT/JP2017/013901 (dated Jan. 10, 2019).
Extended European Search Report (EESR) dated Jun. 8, 2020 issued in European Patent Application No. 17819588.9.
Fabio L. Leite et al, "Theoretical Models for Surface Forces and Adhesion and Their Measurement Using Atomic Force Microscopy", International Journal of Molecular Sciences, Oct. 8, 2012, pp. 12773-12856, vol. 13, No. 12, XP055361895, DOI: 10.3390/ijms131012773; Cited in EESR.

* cited by examiner (COM.EX. = COMPARATIVE EXAMPLE)

(COM.EX. = COMPARATIVE EXAMPLE)

NITRIDE SEMICONDUCTOR LAMINATE, METHOD FOR MANUFACTURING NITRIDE SEMICONDUCTOR LAMINATE, METHOD FOR MANUFACTURING SEMICONDUCTOR LAMINATE, AND METHOD FOR INSPECTING SEMICONDUCTOR LAMINATE

TECHNICAL FIELD

The present invention relates to a nitride semiconductor laminate, a method for manufacturing a nitride semiconductor laminate, a method for manufacturing a semiconductor laminate, and a method for inspecting a semiconductor laminate.

DESCRIPTION OF RELATED ART

A group III nitride semiconductor such as gallium nitride has a higher saturated free electron velocity and a higher dielectric breakdown voltage than those of silicon. Therefore, the group III nitride semiconductor is expected to be applied to semiconductor devices for high frequency high voltage applications (for example, see Non-Patent Documents 1 to 3).
[Non-Patent Document 1] Hiroshi Ohta et al.: IEEE Electron Device Letter 36, p 1180-1182 (2015)
[Non-Patent Document 2] Kenya Nishiguchi et al.: Japanese Journal of Applied Physics 53, 070301 (2014)
[Non-Patent Document 3] Mayumi Hirose et al.: Electronic Device Study Group Document EDD-16-045 p 49-33 (2016)

An object of the present invention is to provide a technique capable of improving long-term reliability of semiconductor devices.

MEANS FOR SOLVING THE PROBLEM

According to an aspect of the present invention, there is provided a nitride semiconductor laminate, including:
a substrate;
an electron transit layer provided on the substrate and containing a group III nitride semiconductor; and
an electron supply layer provided on the electron transit layer and containing a group III nitride semiconductor,
wherein a surface force A of the electron supply layer acting as an attractive force for attracting a probe and a surface of the electron supply layer when measured using the probe consisting of a glass sphere with a diameter of 1 mm covered with Cr, is stronger than a surface force B of Pt when measured under the same condition, and an absolute value |A−B| of a difference between them is 30 μN or more.

According to other aspect of the present invention, there is provided a method for manufacturing a nitride semiconductor laminate, including:
forming an electron transit layer containing a group III nitride semiconductor on a substrate; and
forming an electron supply layer containing a group III nitride semiconductor on the electron transit layer,
wherein in forming the electron supply layer, the electron supply layer is formed so that a surface force A of the electron supply layer acting as an attractive force for attracting a probe and a surface of the electron supply layer when measured using the probe consisting of a glass sphere with a diameter of 1 mm covered with Cr, is stronger than a surface force B of Pt when measured under the same condition, and an absolute value |A−B| of a difference between them is 30 μN or more.

According to further other aspect of the present invention, there is provided a method for manufacturing a nitride semiconductor laminate, including:
forming an electron transit layer containing a group III nitride semiconductor on a substrate;
forming the electron supply layer containing a group III nitride semiconductor on the electron transit layer; and
modifying a surface of the electron supply layer,
wherein in modifying the surface of the electron supply layer, the surface of the electron supply layer is modified so that a surface force A of the electron supply layer acting as an attractive force for attracting a probe and a surface of the electron supply layer when measured using the probe consisting of a glass sphere with a diameter of 1 mm covered with Cr, is stronger than a surface force B of Pt when measured under the same condition, and an absolute value |A−B| of a difference between them is 30 μN or more.

According to further other aspect of the present invention, there is provided a method for manufacturing a semiconductor laminate, including:
sequentially forming an electron transit layer and an electron supply layer on a substrate, thereby forming a semiconductor laminate having the electron transit layer and the electron supply layer;
measuring a surface force of the electron supply layer acting between a probe and a surface of the electron supply layer by using a predetermined probe; and
selecting the semiconductor laminate based on the surface force of the electron supply layer.

According to further other aspect of the present invention, there is provided a method for inspecting a semiconductor laminate, for inspecting a semiconductor laminate in which an electron transit layer and an electron supply layer are sequentially provided on a substrate, the method including:
measuring a surface force of the electron supply layer acting between the probe and the surface of the electron supply layer by using a predetermined probe; and
selecting the semiconductor laminate based on the surface force of the electron supply layer.

ADVANTAGE OF THE INVENTION

According to the present invention, long-term reliability of a semiconductor device can be improved.

DETAILED DESCRIPTION OF THE EMBODIMENT

<Knowledge Obtained by the Inventors>

Figure 1:
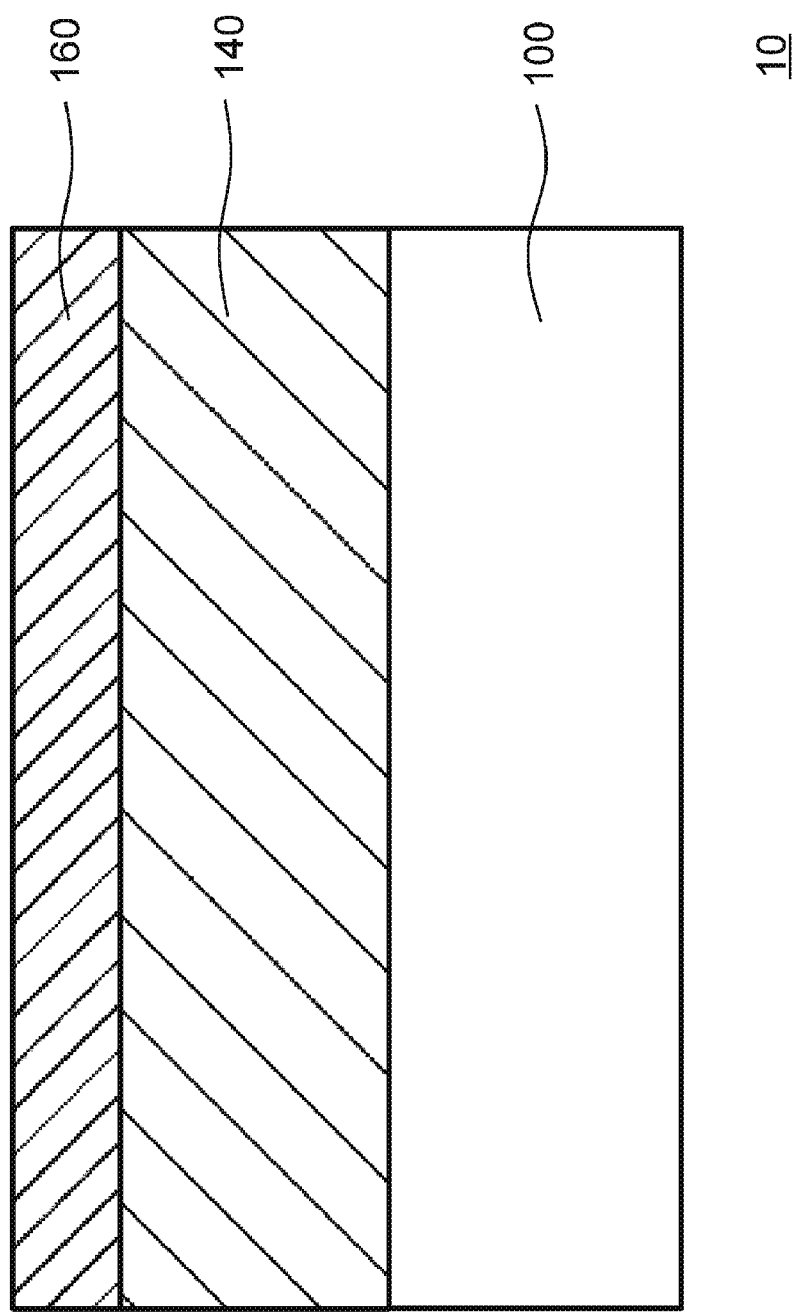
FIG. 1 is a cross-sectional view showing a nitride semiconductor laminate according to an embodiment of the present invention.

As a group III nitride semiconductor-based semiconductor device, for example, a high electron mobility transistor (HEMT: High Electron Mobility Transistor) is known. The HEMT has, for example, an electron transit layer containing gallium nitride (GaN) and an electron supply layer containing aluminum gallium nitride (AlGaN). In the HEMT, a high concentration two-dimensional electron gas is induced in the vicinity of a heterojunction interface in the electron transit layer due to a polarization effect of the electron supply layer. Since the two-dimensional electron gas is induced in the electron transit layer to which a conductive impurity serving as a scattering factor is not added, high electron mobility is exhibited. Thereby, it is possible to drive the HEMT at high speed with high power.

However, as a result of inventor's intensive studies, it is found that a drain current is gradually decreased over time when HEMT is continuously driven with high power. Further, it is found by the inventors of the present invention, that surface physical properties of the electron supply layer affects the long-term reliability such as a decrease of the drain current over time. The present invention is provided based on the above-described knowledge found by the inventors of the present invention.

<One Embodiment of the Present Invention>

An embodiment of the present invention will be described hereafter, with reference to the drawing.

(1) Nitride Semiconductor Laminate

A nitride semiconductor laminate according to an embodiment of the present invention will be described first, using FIG. 1. FIG. 1 is a cross-sectional view showing a nitride semiconductor laminate according to an embodiment of the present invention. The nitride semiconductor laminate 10 of this embodiment is configured as, for example, a precursor for manufacturing the HEMT, and has a substrate 100, an electron transit layer (buffer layer, channel layer) 140, and an electron supply layer (barrier layer) 160.

(Substrate)

The substrate 100 is configured as an underlying substrate for epitaxially growing the electron transit layer 140 and the electron supply layer 160, and is configured, for example, as a silicon carbide (SiC) substrate in this embodiment. Specifically, as the substrate 100, for example, a semi-insulating SiC substrate of polytype 4H or polytype 6H is used. Note that the surface of the substrate 100 is a (0001) plane (c plane). Further, the numbers 4H and 6H indicate a repetition period in a c-axis direction, and H indicates a hexagonal crystal.

Further, the substrate 100 has, for example, a semi-insulating property. The "Semi-insulating property" as used herein means, for example, a state in which a specific resistance is $10^5$ Ω·cm or more. Thereby, it is possible to suppress diffusion of free electrons from the electron transit layer 140 to the substrate 100 and suppress a leakage current.

Note that for example, a nucleation layer (not shown) is provided on the substrate 100. For example, the nucleation layer is configured so that a region located on the substrate 100 side of the nucleation layer functions as a buffer layer mainly for buffering a lattice constant difference between the substrate 100 and the electron transit layer 140, and a region located on the electron transit layer 140 side of the nucleation layer mainly forms a crystal nucleus for crystal growth of the electron transit layer 140. The nucleation layer contains a group III nitride semiconductor, and in this embodiment, contains, for example, aluminum nitride (AlN) as a main component.

(Electron Transit Layer)

The electron transit layer 140 is provided on the substrate 100, and is configured so that, for example, a region located on the nucleation layer side of the electron transit layer 140 functions mainly a buffer layer for buffering the lattice constant difference between the nucleation layer and the electron supply layer 160, and is configured so that a region located on the electron supply layer 160 side of the electron transit layer 140 causes electrons to run when a semiconductor device 20 described later is driven. The electron transit layer 140 contains a group III nitride semiconductor, and in this embodiment, for example, contains GaN as a main component. Further, the surface (upper surface) of the electron transit layer 140 is configured as a group III atom polar plane (+c plane).

A thickness of the electron transit layer 140 is, for example, 500 nm or more and 2500 nm or less. If the thickness of the electron transit layer 140 is less than 500 nm, there is a possibility that a quality of the electron transit layer 140 is deteriorated and its electron mobility is decreased. In contrast, by setting the thickness of the electron transit layer 140 to 500 nm or more, the quality of the electron transit layer 140 can be improved and its electron mobility can be a predetermined value or more. Meanwhile, even if the thickness of the electron transit layer 140 is more than 2500 nm, the quality of the electron transit layer 140 is not improved so much, and only a growth cost is increased. In contrast, by setting the thickness of the electron transit layer 140 to 2500 nm or less, it is possible to suppress an increase of the growth cost while securing a good quality of the electron transit layer 140.

(Electron Supply Layer)

The electron supply layer 160 is provided on the electron transit layer 140 and is configured to generate two-dimensional electron gas into the electron transit layer 140, and to spatially confine the two-dimensional electron gas in the electron transit layer 140. Specifically, the electron supply layer 160 contains a group III nitride semiconductor having a wider band gap than the group III nitride semiconductor constituting the electron transit layer 140 and a lattice constant smaller than the lattice constant of the electron transit layer 140, and in this embodiment, contains, for example AlGaN as a main component. Further, a surface (upper surface) of the electron supply layer 160 is configured as a group III atom polar plane (+c plane). With such a configuration, spontaneous polarization and piezo polarization are generated in the electron supply layer 160. Then, due to the polarization effect, a high concentration two-dimensional electron gas is induced in the vicinity of the heterojunction interface in the electron transit layer 140.

Here, it is found by the inventors of the present invention that the surface force on the surface (upper surface) of the electron supply layer 160 greatly affects long-term reliability of the semiconductor device 20. The term "surface force" as used herein means an attractive force or a repulsive force acting between two objects approaching or contacting each other, and originates from at least one of electrostatic force, ionic interaction, hydrogen bonding, van der Waals force, meniscus force, and the like. The surface force of the film, which is measurement object, is obtained for example, by measuring force (mainly attractive force in this embodiment) acting between a probe and a film by using a predetermined probe. Note that details of the surface force measurement method will be described later.

Here, the surface force of a predetermined film may cause error when a sample type or a measurement environment is different. Therefore, the surface force of platinum (Pt) is measured as a reference under the same condition as the surface force of a predetermined film, and the surface force of the predetermined film is defined as a relative relation to the surface force of Pt, to thereby make it possible to accurately compare the surface force of the predetermined film even when the sample type or measurement environment is different. Note that the surface force of Pt as used herein specifically means surface force of a Pt film formed on a silicon (Si) substrate.

In this embodiment, for example, the surface force A of the electron supply layer 160 which acts as an attractive force to attract the probe and the surface of the electron supply layer 160, when measured in vacuum using the probe (tracing stylus) consisting of a glass sphere (glass sphere material BK7 having diameter 1 mm, and surface roughness Ra2 nm, Rz 11 nm) covered with chromium (Cr), is stronger than the surface force B of Pt when measured under the same condition. Note that the "surface force which acts as an attractive force" here is detected as a negative value in actual measurement. Therefore, "the surface force A of the electron supply layer 160 is stronger than the surface force B of Pt" means that an actually measured value of the surface force of the electron supply layer 160 is smaller (actually larger on the minus side) than an actually measured value of the surface force of Pt, and means that in other words, "an absolute value of the surface force A of the electron supply layer 160 is larger than an absolute value of the surface force of Pt".

Further, the absolute value |A−B| of the difference between the surface force A of the electron supply layer 160 and the surface force B of Pt, when measured under the above condition, is for example, 30 μN or more. If the absolute value |A−B| of the difference in surface force is less than 30 μN, there is a possibility that the drain current is decreased over time in the semiconductor device 20 as a HEMT described later. In contrast, by setting the absolute value |A−B| of the difference in surface force to 30 μN or more, it is possible to suppress the decrease of the drain current over time. Further, it is more preferable that the absolute value |A−B| of the difference in surface force is, for example, 45 μN or more. Thereby, it is possible to more reliably suppress the decrease of the drain current over time. Note that it is found that the stronger the surface force A of the electron supply layer 160 is (the smaller the measured value is), the decrease of the drain current over time is suppressed. Therefore, an upper limit value of the absolute value |A−B| of the difference in surface force is not particularly limited. However, a load is imposed on a manufacturing apparatus depending on the manufacturing condition under which a predetermined surface force can be obtained, and as a result there is a possibility that a maintenance cost of the manufacturing apparatus is increased. Accordingly, for example, it is preferable that the absolute value |A−B| of the difference in surface force is 120 μN or less.

"The absolute value |A−B| of the difference between the surface force A of the electron supply layer 160 and the surface force B of Pt is 30 μN or more, preferably 45 μN or more" means, in other words, "the surface force A of the electron supply layer 160 is−30 μN or less, preferably −45 μN or less with the surface force B of Pt as a reference", or "the surface force A which is the attractive three of the electron supply layer 160 is strong by 30 μN or more, preferably by 45 μN or more with the surface force B which is the attractive force of Pt as a reference".

The thickness of the electron supply layer 160 is, for example, 5 nm or more and 50 nm or less. If the thickness of the electron supply layer 160 is less than 5 nm, there is a possibility that a gate leakage is increased and the reliability of the semiconductor device 20 is reduced. In contrast, by setting the thickness of the electron supply layer 160 to 5 nm or more, the gate leakage can be suppressed and the reliability of the semiconductor device 20 can be secured. Meanwhile, if the thickness of the electron supply layer 160 is more than 50 nm, there is a possibility that a threshold voltage is increased and switching characteristics are deteriorated. In contrast, by setting the thickness of the electron supply layer 160 to 50 nm or less, the threshold voltage can be a predetermined value or less, and the switching characteristics can be improved. In consideration of the above tendency, the thickness of the electron supply layer 160 is preferably, for example, 15 nm or more and 30 nm or less.

(2) Semiconductor Device

Figure 2:
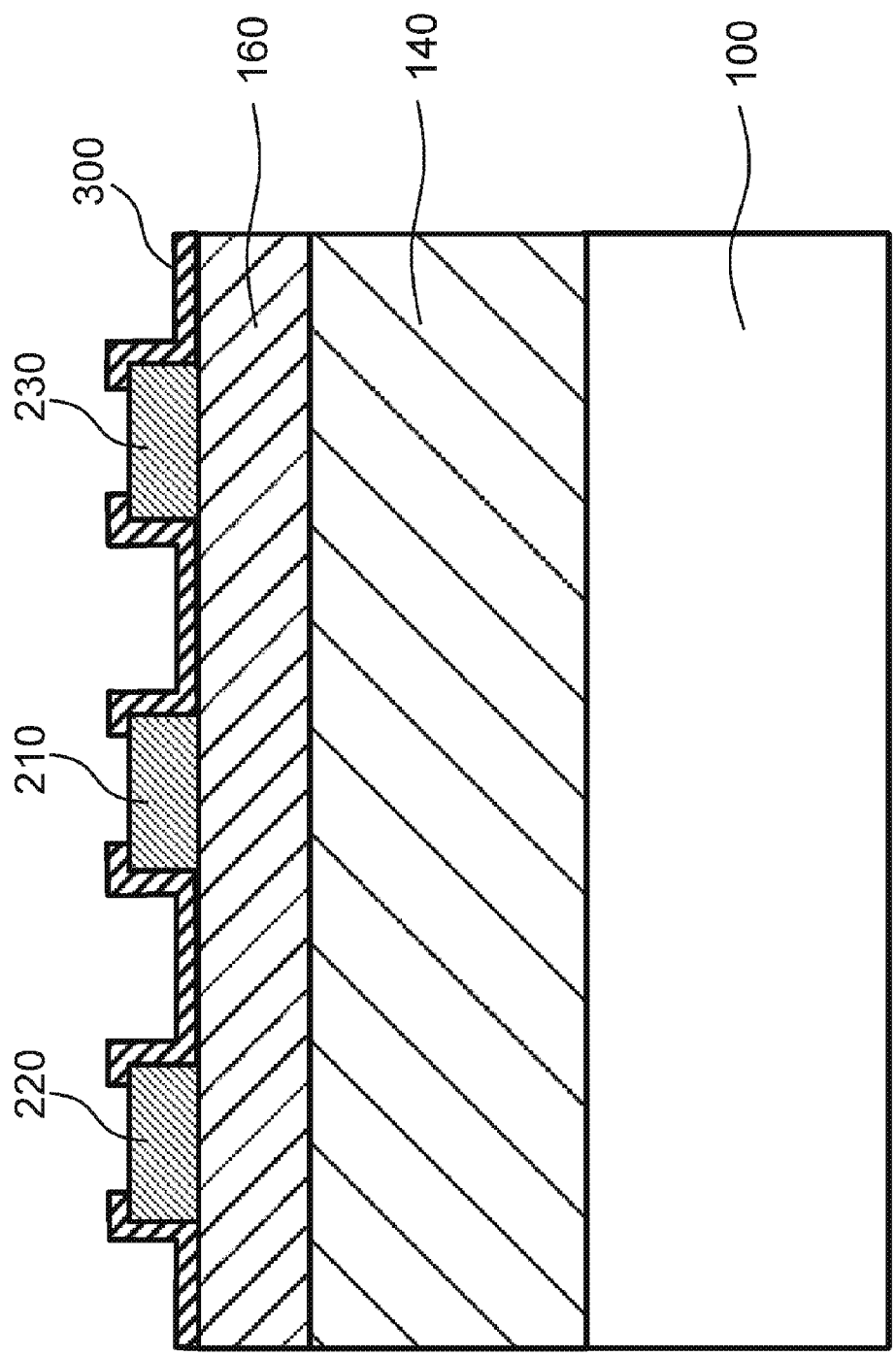
FIG. 2 is a cross-sectional view showing a semiconductor device according to an embodiment of the present invention.

A semiconductor device of this embodiment will be described next, using FIG. 2. FIG. 2 is a cross-sectional view showing the semiconductor device according to an embodiment of the present invention.

As shown in FIG. 2, the semiconductor device 20 of this embodiment is manufactured using, for example, the above-described nitride semiconductor laminate 10, and is configured as HEMT. Specifically, the semiconductor device 20 has, for example, a substrate 100, an electron transit layer 140, an electron supply layer 160, a gate electrode 210, a source electrode 220, a drain electrode 230, and a protective film 300.

(Electrode)

The gate electrode 210 is provided on the electron supply layer 160. The gate electrode 210 is configured as a multi layer structure (Ni/Au) of, for example, nickel (Ni) and gold (Au). Note that in this specification, when it is described as a multilayer structure of X/Y it means that X and Y are laminated in this order.

The source electrode 220 is provided on the electron supply layer 160 and is disposed at a position separated from the gate electrode 210 by a predetermined distance. The source electrode 220 has a multilayer structure of, for example, titanium (Ti) and aluminum (Al).

The drain electrode 230 is provided on the electron supply layer 160, and is disposed at a position separated from the gate electrode 210 by a predetermined distance on the side opposite to the source electrode 220 with the gate electrode 210 interposed therebetween. Similarly to the source electrode 220, the drain electrode 230 has a multilayer structure of Ti and Al, for example. Note that in the source electrode 220 and the drain electrode 230, the multilayer structure of Ni/Au may be stacked on the multilayer structure of Ti/Al.

(Protective Film)

The protective film 300 is configured to protect the surface of the electron supply layer 160 and the like, and is configured to suppress deterioration of the electron supply layer 160 and the like. Specifically, the protective film 300 is provided so as to cover the surface of the electron supply layer 160, at least, between the gate electrode 210 and the source electrode 220, between the gate electrode 210 and the drain electrode 230, and the outside of the source electrode 220 or the drain electrode 230. The protective film 300 contains, for example, silicon nitride (SiN).

Nitrogen (N) ions may be ion-implanted into the electron transit layer 140, so as to surround a device region including the source electrode 220, the gate electrode 210, and the drain electrode 230 in plan view. Thereby, it is possible to inactivate two-dimensional electron gas outside of the device region and secure insulation between adjacent device regions.

Further, silicon (Si) ions may be ion-implanted into the electron transit layer 140 and the electron supply layer 160, in a region overlapping with the source electrode 220 and the drain electrode 230 in plan view. Thereby, a contact resistance of each of the source electrode 220 and the drain electrode 230 can be reduced. In this case, for example, it is preferable that each Si ion has a profile such that a peak is located at a depth of about 50 nm from the surface of the electron supply layer 160.

As described above, since the surface force A of the electron supply layer 160 satisfies a predetermined characteristic, it is possible to suppress the decrease of the drain current over time when the semiconductor device 20 is driven. Specifically, the ratio $I_{ds}/I_{ds0}$ of the drain current $I_{ds}$ after 1000 hours with respect to the initial drain current $I_{ds0}$ can be 0.70 or more, preferably 0.90 or more, when the semiconductor device 20 is driven under conditions that (in the semiconductor device 20 in which the protective film 300 is not provided), the temperature is 200° C. the voltage $V_{ds}$ between the source electrode 220 and the drain electrode 230 is 50 V, and the voltage $V_{gs}$ between the gate electrode 210 and the source electrode 220 is −2V.

Figure 3:
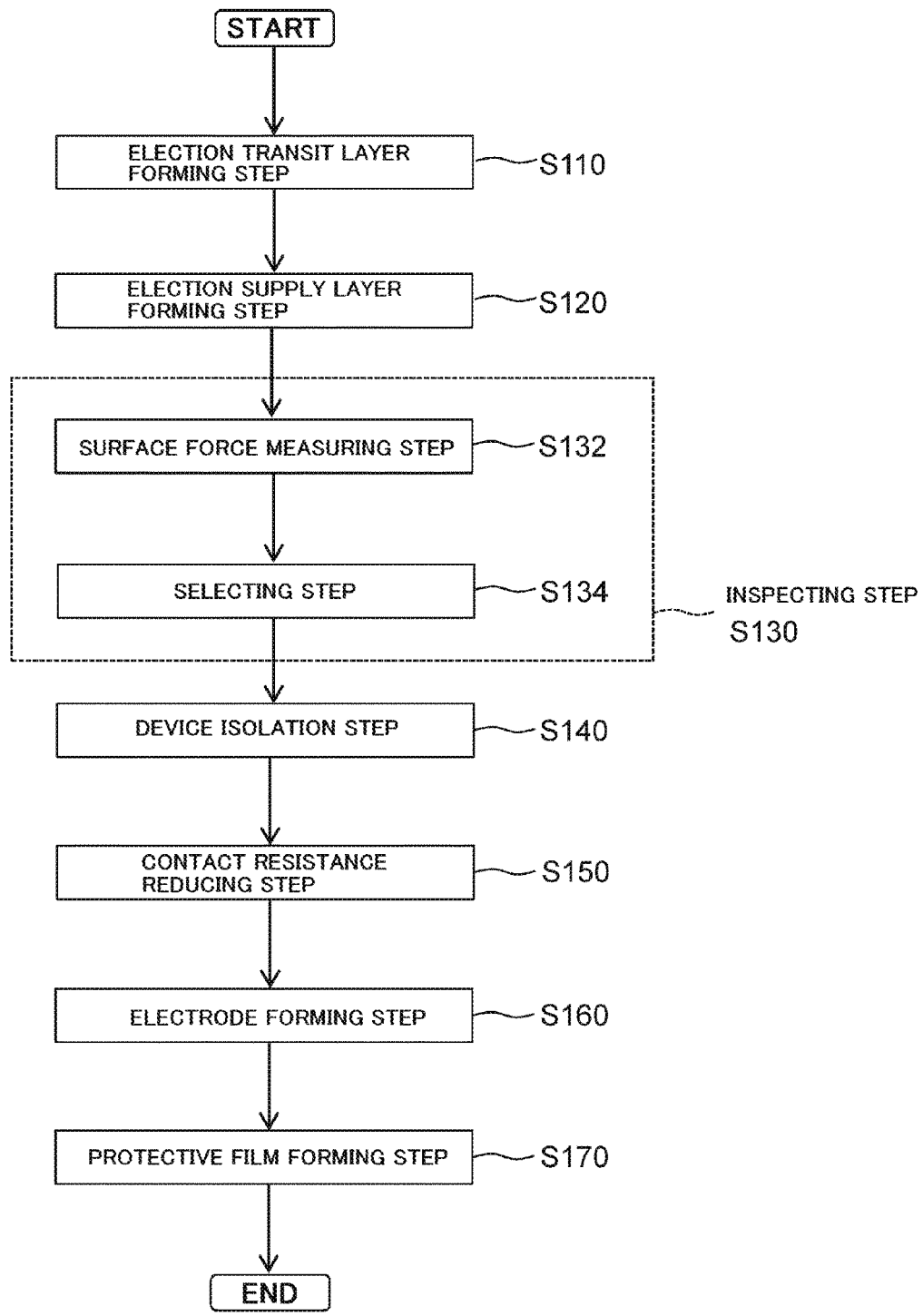
FIG. 3 is a flowchart showing a method for manufacturing a semiconductor device according to an embodiment of the present invention.

(3) A Method for Manufacturing a Nitride Semiconductor Laminate and a Method for Manufacturing a Semiconductor Device A method for manufacturing a nitride semiconductor laminate and a method for manufacturing a semiconductor device will be described next, using FIG. 3. FIG. 3 is a flowchart showing the method for manufacturing a semiconductor device according to an embodiment of the present invention. The step is abbreviated as S.

First, for example, the nitride semiconductor laminate 10 is formed by a metal organic vapor phase epitaxy (MOVPE: Metal Organic Vapor Phase Epitaxy) apparatus by the following procedure.

(S110: Electron Transit Layer Forming Step)

First, for example, a semi-insulating SiC substrate of polytype 4H is prepared as the substrate 100. Then, the substrate 100 is loaded into a processing chamber of the MOVPE apparatus. Then, hydrogen ($H_2$) gas (or a mixed gas of $H_2$ gas and nitrogen ($N_2$) gas) is supplied into the processing chamber, and a temperature of the substrate 100 is raised to a predetermined growth temperature (for example, 1150° C. or more and 1250° C. or less) of the nucleation layer. When the temperature of the substrate 100 reaches the predetermined growth temperature, for example, trimethylaluminum (TMA) gas as a Group III source gas and ammonia ($NH_3$) gas as a Group V source gas are supplied to the substrate 100. Thereby, the nucleation layer containing AlN is grown on the substrate 100. When the growth of the nucleation layer having a predetermined thickness is completed, supply of the TMA gas is stopped. At this time, supply of the $NH_3$ gas is continued.

Next, the temperature of the substrate 100 is adjusted to a predetermined growth temperature (for example, 1000° C. or more and 1100° C. or less) of the electron transit layer 140. Then, when the temperature of the substrate 100 reaches a predetermined growth temperature, for example, trimethylgallium (TMG) gas is supplied as a Group III source gas while supply of the $NH_3$ gas is continued. Thereby, the electron transit layer 140 made of monocrystalline GaN is epitaxially grown on the nucleation layer.

When the growth of the electron transit layer 140 having a predetermined thickness is completed, supply of TMG gas is stopped. At this time, supply of $NH_3$ gas is continued.

(S120: Electron Supply Layer Forming Step)

Next, for example, the temperature of the substrate 100 is set to a predetermined growth temperature (for example, 1000° C. or more and 1100° C. or less) of the electron supply layer 160. Then, when the temperature of the substrate 100 reaches a predetermined growth temperature, for example, TMG gas and TMA gas are supplied as Group III source gases while supply of the $NH_3$ gas is continued. Thereby, the electron supply layer 160 containing monocrystalline AlGaN is epitaxially grown on the electron transit layer 140.

When the growth of the electron transit layer 140 having a predetermined thickness is completed, supply of TMG gas and TMA gas is stopped, and the temperature of the substrate 100 is lowered from the growth temperature of the electron supply layer 160. At this time, normally, $H_2$ gas is stopped, $N_2$ gas is supplied, and the supply of $NH_3$ gas is continued (when $N_2$ gas is supplied together with $H_2$ gas during growth of the electron transit layer 140 and the electron supply layer 160, $H_2$ gas is stopped and supply of $N_2$ gas and $NH_3$ gas is continued). Then, when the temperature of the nitride semiconductor laminate 10 becomes 500° C. or lower, supply of $NH_3$ gas is stopped, and the atmosphere in the processing chamber of the MOVPE apparatus is replaced with $N_2$ gas only to restore the atmospheric pressure.

At this time, in this embodiment, the electron supply layer 160 is formed so that the surface force A of the electron supply layer 160 which acts as an attractive force to attract the probe and the surface of the electron supply layer 160 when measured in a vacuum using the probe consisting of a glass sphere having a diameter of 1 mm covered with Cr, is stronger than the surface force B of Pt when measured under the same conditions, and the absolute value |A−B| of the difference between them is 30 μN or more. As a result of intensive studies by the inventors of the present invention, it is found that the electron supply layer 160 can be formed so that the surface force A of the electron supply layer 160 satisfies the above-described predetermined characteristics, by adjusting a cooling condition, etc., when lowering the temperature of the substrate 100 from the growth temperature of the electron supply layer 160.

Specifically, a cooling rate when lowering the temperature of the substrate 100 from the growth temperature of the electron supply layer 160 is, for example, 1.0° C./s or more. If the cooling rate is less than 1.0° C./s, there is a possibility that a sufficient surface force is not obtained in the electron supply layer 160. In contrast, by setting the cooling rate to 1.0° C./s or more, the surface force of the electron supply layer 160 can be improved. Further, it is more preferable to set the cooling rate to 1.5° C./s or more. Thereby, the surface force of the electron supply layer 160 can be more reliably improved. A natural cooling rate at the time of turning off a power supply of a heater for heating the substrate 100 is, for example, approximately 3° C./s, although it depends on a configuration of the used MOVPE apparatus. As described later, when supplying $H_2$ gas or He gas as a cooling gas to the surface of the electron supply layer 160, the natural cooling rate at the time of turning off the power of the heater is, for example, approximately 4° C./s.

Further, when the temperature of the substrate 100 is lowered from the growth temperature of the electron supply layer 160, $H_2$ gas or helium (He) gas may be supplied as a cooling gas to the surface of the electron supply layer 160. Namely, in this embodiment, $H_2$ gas or He gas may be supplied in addition to $N_2$ gas and $NH_3$ gas. A specific heat of $H_2$ gas (about 14000 J/(kg·K)) and a specific heat of He gas (about 5000 J/(kg·K)), are larger than a specific heat of $N_2$ gas (about 1000 J/(kg·K)) or a specific heat of $NH_3$ gas (about 2000 J/(kg·K)). Accordingly, by supplying $H_2$ gas or He gas having a large specific heat to the surface of the electron supply layer 160, it is possible to improve cooling efficiency of the surface of the electron supply layer 160. Thereby, the surface force of the electron supply layer 160 can be improved as in the case that the cooling rate at the time of lowering the temperature of the substrate 100 from the growth temperature of the electron supply layer 160 is the predetermined value or more.

Thereafter, when the temperature of the nitride semiconductor laminate 10 is lowered to a temperature at which it can be carried out, the nitride semiconductor laminate 10 is carried out from the processing chamber.

As described above, the nitride semiconductor laminate 10 of this embodiment shown in FIG. 1 is manufactured.

(S130: Inspecting Step)

Next, an inspecting step S130 of inspecting the nitride semiconductor laminate 10 based on the surface force of the electron supply layer 160 is performed. The inspecting step S130 of this embodiment includes, for example, a surface force measuring step S132 and a selecting step S134.

(S132: Surface Force Measuring Step)

First, the surface force of Pt as a reference and the surface force of the electron supply layer 160 of the nitride semiconductor laminate 10 manufactured as described above are measured. For measuring the surface force, for example, a surface force measuring equipment (ESF-5000) manufactured by Elionix Co., Ltd can be suitably used.

Figure 4:
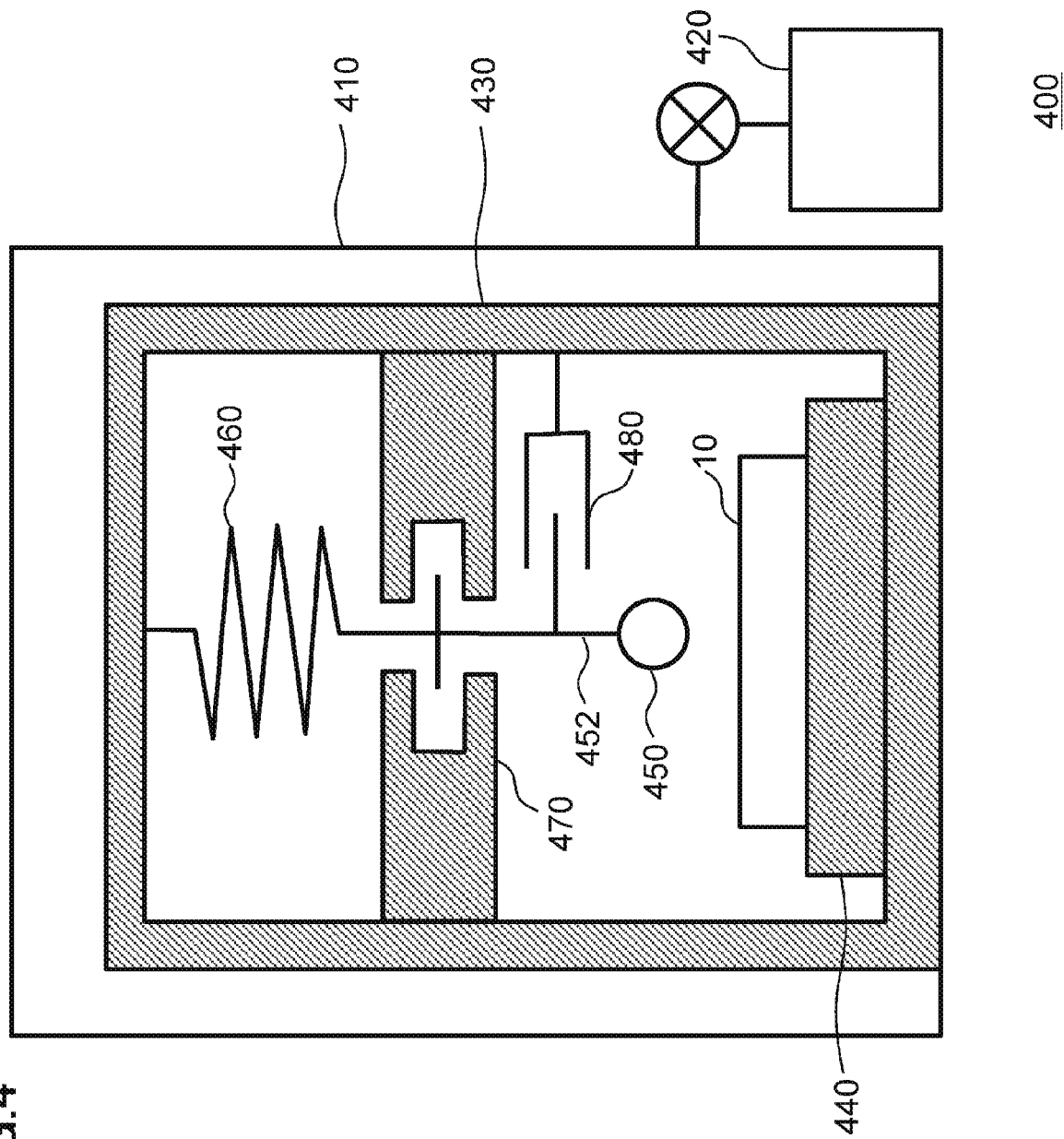
FIG. 4 is a schematic configuration view showing a surface force measuring equipment.

Here, FIG. 4 is a schematic configuration view showing the surface force measuring equipment.

As shown in FIG. 4, the surface force measuring equipment 400 includes: for example, a vacuum chamber 410, a vacuum pump 420, a fixed frame 430, a stage 440, a probe 450, a support rod 452, a spring mechanism 460, an electromagnetic force generator 470, and a displacement meter 480. The vacuum chamber 410 is configured to accommodate each member such as the fixed frame 430, and to be able to evacuate an atmosphere inside thereof to a vacuum by the vacuum pump 420. The fixed frame 430 is configured to fix and support each member accommodated in the vacuum chamber 410. The stage 440 is provided on the bottom of the fixed frame 430, and is configured so that measurement object (for example, the nitride semiconductor laminate 10) is placed thereon. Further, the stage 440 includes; a coarse movement stage (not shown) for moving the measurement object in a horizontal direction and a vertical direction, and a fine movement stage (not shown) for fine positioning of the measurement object in the vertical direction. The probe 450 is configured to function as a probe for measuring the surface force. The support rod 452 supports the probe 450 on the vertical upper side of the stage 440. The spring mechanism 460 is interposed between the support rod 452 and the upper portion of the fixed frame 430, and is configured to allow the support rod 452 to move only in the vertical direction while elastically holding the support rod 452. The electromagnetic force generator 470 is configured to add a vertical load on the support rod 452 by an electromagnetic force. The displacement meter 480 is configured to detect a vertical displacement of the support rod 452, that is, a vertical displacement of the probe 450. A displacement sensor of a non-contact type (for example, optical type) is suitably used as the displacement meter 480.

The surface force acting between the measurement object and the probe 450 (attractive force in this embodiment) is determined by measuring the force required to separate the probe 450 in contact with the measurement object from the measurement object. Specifically, measurement is performed in the following procedure.

Figure 5:
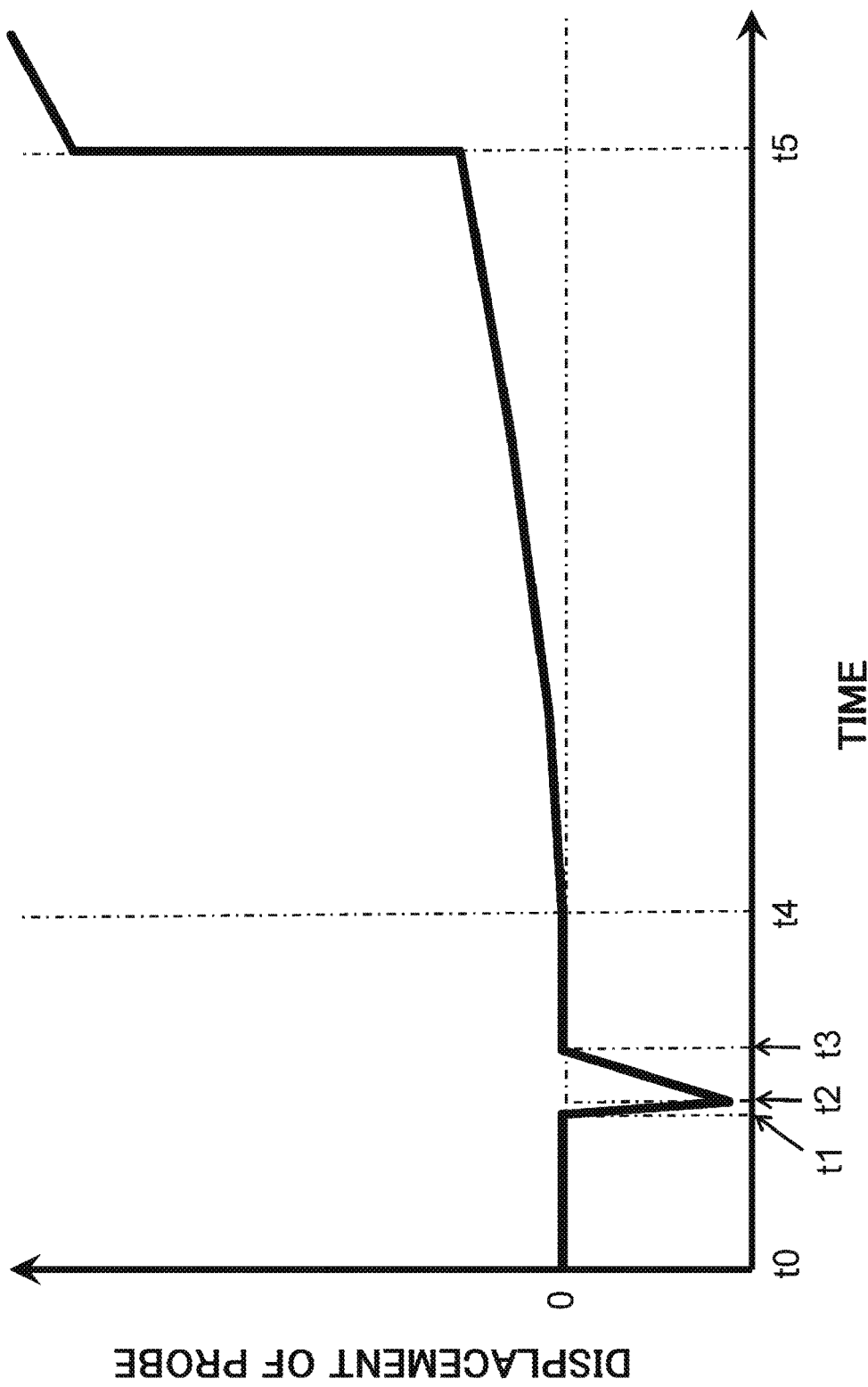
FIG. 5 is a view showing a surface force measuring step.

FIG. 5 is a view showing a surface force measuring step. In FIG. 5, a horizontal axis represents time and a vertical axis represents displacement (in the vertical direction) of the probe 450.

First, a measurement object is placed on the stage 440, and the atmosphere in the vacuum chamber 410 is evacuated to vacuum. When the inside of the vacuum chamber 410 reaches a predetermined pressure, the stage 440 is gradually moved vertically upward to bring the measurement object closer to the probe 450 (t0→t1). Then, as the measurement object approaches the probe 450, the surface force acts between the measurement object and the probe 450. Thereby, the probe 450 is attracted to the measurement object, by the surface force of the measurement object, and descends against the elastic force of the spring mechanism 460 and contacts the measurement object (t1→t2). Here, when the surface force is measured by separating the probe 450 from the measurement object, with the elastic force of the spring mechanism 460 acting on the probe 450, there is a possibility of causing error. Therefore, the stage 440 is ascended, the probe 450 is returned to the initial position, and the elastic force generated in the spring mechanism 460 is made zero (t2→t3). Then, a predetermined standby time is provided until the spring mechanism 460 comes to a standstill state (t3→t4). Then, a force for separating the probe 450 from the measurement object is applied, by gradually moving the support rod 452 in the vertical upward direction by the electromagnetic force of the electromagnetic force generator 470 (t4→t5). Then, when the force separating the probe 450 from the measurement object exceeds the surface force of the measurement object, the probe 450 is separated from the measurement object (t5). At this time, a time point when the probe 450 is separated from the measurement object is detected by the displacement meter 480. Then, a current value flowing in the electromagnetic force generator 470 is acquired at a moment when the probe 450 is separated from the measurement object, and the surface force of the measurement object is determined based on the current value.

In this embodiment, in the surface force measuring equipment 400 described above, the surface force B of Pt which acts as the attractive force to attract the Pt and the probe 450 is previously measured in vacuum, using the probe 450 consisting of a glass sphere (glass spherical material BK7, diameter 1 mm, surface roughness Ra 2 nm, Rz 11 nm) covered with Cr. Then, the surface force A of the electron supply layer 160 which acts as the attractive force to attract the probe 450 and the surface of the electron supply layer 160 of the nitride semiconductor laminate 10 manufactured as described above, is measured under the same conditions.

(S134: Selecting Step)

Next, the nitride semiconductor laminate 10 is selected, based on the surface force of the electron supply layer 160 measured in the surface force measuring step S132. Specifically, the nitride semiconductor laminate 10 that does not satisfy a first selecting condition is excluded as a defective product, the first selecting condition being that the surface force A of the electron supply layer 160 is stronger than the surface force B of Pt and the absolute value |A−B| of the difference between them is 30 µN or more. Meanwhile, the nitride semiconductor laminate 10 satisfying the first selecting condition is selected as a good product. Thereby, it is possible to exclude the nitride semiconductor laminate 10 in which the drain current at the time of driving the semiconductor device 20 is decreased over time, and to nondestructively select the nitride semiconductor laminate 10 in which the decrease of the drain current over time can be suppressed, before manufacturing the semiconductor device 20.

Further, it is also possible to select the nitride semiconductor laminate 10 satisfying a second selecting condition as a best product, the second selecting condition being that the surface force A of the electron supply layer 160 is stronger than the surface force B of Pt and the absolute value |A−B| of the difference between them is 45 μN or more. Thereby, it is possible to select the nitride semiconductor laminate 10 capable of more reliably suppressing the decrease of the drain current over time.

(S140: Device Isolation Step)

Next, a resist film is formed on the nitride semiconductor laminate 10 which is selected as a good product or a best product, and the resist film is patterned so that the region surrounding the device region becomes an opening, the device region where the source electrode 220, the gate electrode 210, and the drain electrode 230 are formed in plan view. Then, N ions are implanted into the electron transit layer 140 in the region surrounding the device region in plan view, using the resist film as a mask. Thereby, it is possible to inactivate the two-dimensional electron gas outside of the device region and secure insulation between adjacent device regions.

(S150: Contact Resistance Reducing Step)

Next, a resist film is formed on the nitride semiconductor laminate 10, and the resist film is patterned so that regions where the source electrode 220 and the drain electrode 230 are formed in plan view become openings. Then, Si ions are implanted into the electron transit layer 140 and the electron supply layer 160, in the regions where the source electrode 220 and the drain electrode 230 are respectively formed in plan view, using the resist film as a mask. Then, SiN film is formed on the nitride semiconductor laminate 10 as a cap layer by, for example, a plasma chemical vapor deposition (P-CVD) method. Thereby, nitrogen desorption from the group III nitride semiconductor constituting the nitride semiconductor laminate 10 can be suppressed. Then, the nitride semiconductor laminate 10 covered with the SiN film is annealed at a predetermined temperature for a predetermined time in an $N_2$ atmosphere (for example, at 1200° C. for 1 minute). Thereby, it is possible to activate Si ions implanted into the electron transit layer 140 and the electron supply layer 160, and to reduce the contact resistance of each of the source electrode 220 and the drain electrode 230 formed in a later step. Then, the SiN film on the nitride semiconductor laminate 10 is removed using a predetermined solvent (for example, buffered hydrofluoric acid).

(S160: Electrode Forming Step)

Next, the resist film is formed on the electron supply layer 160, and the resist film is patterned so that the regions where the source electrode 220 and the drain electrode 230 are formed in plan view become openings. Then, for example, the multilayer structure of Ti/Al (or the multilayer structure of Ti/Al/Ni/Au) is formed by electron beam evaporation so as to cover the electron supply layer 160 and the resist film. Then, by removing the resist film by liftoff using a predetermined solvent, the source electrode 220 and the drain electrode 230 are formed in the predetermined region. Then, the nitride semiconductor laminate 10 is annealed at a predetermined temperature for a predetermined time in an $N_2$ atmosphere (for example, at 650° C. for 3 minutes). Thereby, each of the source electrode 220 and the drain electrode 230 can be in ohmically contact with the electron supply layer 160.

Next, the resist film is formed so as to cover the electron supply layer 160, the source electrode 220, and the drain electrode 230, and the resist film is patterned so that the region where the gate electrode 210 is formed in plan view becomes an opening. Then, for example, the multilayer structure of Ni/Au is formed by electron beam evaporation so as to cover the electron supply layer 160 and the resist film. Then, by removing the resist film by lift-off using a predetermined solvent, the gate electrode 210 is formed in the predetermined region. Then, the nitride semiconductor laminate 10 is annealed at a predetermined temperature for a predetermined time in a $N_2$ atmosphere (for example, 450° C. for 10 minutes).

(S170: Protective Film Forming Step)

Next, for example, a protective film 300 containing SiN is formed by a P-CVD method so as to cover the electron supply layer 160 and each electrode. Then, the protective film 300 is patterned so that only a part of the upper surface of each electrode is exposed. Thereby, the protective film 300 is formed so as to cover the surface of the electron supply layer 160 between the gate electrode 210 and the source electrode 220, between the gate electrode 210 and the drain electrode 230, and outside of the source electrode 220 or the drain electrode 230.

As described above, the semiconductor device 20 of this embodiment shown in is manufactured.

(4) Effects Obtained by This Embodiment

According to this embodiment, one or more of the following effects can be obtained.

(a) In this embodiment, the surface force A of the electron supply layer 160 acting as the attractive force for attracting the probe and the surface of the electron supply layer 160 when measured using the probe consisting of a glass sphere with a diameter of 1 mm covered with Cr, is stronger than the surface force B of Pt when measured under the same condition, and the absolute value |A−B| of the difference between them is 30 μN or more. Thereby, it is possible to suppress the decrease of the drain current over time when the semiconductor device 20 is driven and it is possible to improve the long-term reliability of the semiconductor device 20. This is considered to be due to the following effects, for example. Since the surface force A of the electron supply layer 160 satisfies a predetermined characteristic, it is possible to suppress accumulation of a negative charge over time in the vicinity of the surface of the electron supply layer 160 and suppress the increase of an effective gate length (channel length). Further, since the accumulation of the negative charge over time in the vicinity of the surface of the electron supply layer 160 can be suppressed, it is possible to suppress band inclination and potential rise in the vicinity of the surface of the electron supply layer 160 and maintain the concentration of the two-dimensional electron gas in the electron transit layer 140 at a predetermined concentration. As a result thereof, it can be considered that the decrease of the drain current over time can be suppressed when the semiconductor device 20 is driven.

Non-Patent Document 2 teaches that due to the accumulation of the negative charge in the vicinity of the surface of the electron supply layer 160, the concentration of the two-dimensional electron gas in the electron transit layer 140 is decreased, and as a result thereof, the drain current is decreased. Accordingly, it can be considered that the above effect in this embodiment by suppressing the accumulation of the negative charge over time in the vicinity of the surface of the electron supply layer 160, is not inconsistent with the contents described in Non-Patent Document 2.

(b) Since the surface force A of the electron supply layer 160 satisfies the above-described predetermined characteristic, it is possible to improve adhesion of the protective film 300 formed on the electron supply layer 160, and suppress deterioration over time of the electron transit layer 140 and the electron supply layer 160 in the nitride semiconductor laminate 10. As a result, it is possible to suppress the decrease of the drain current over time when the semiconductor device 20 is driven.

Non-Patent Document 3 teaches that in the HEMT covered with a nitride film having a low electrical conductivity (that is, a high insulating property), the decrease of the drain current can be suppressed. Accordingly, it can be considered that the above effect in this embodiment by improving the adhesion of the protective film 300 formed on the electron supply layer 160 is not inconsistent with the content described in Non-Patent Document 3, in consideration of the fact that the adhesion of the protective film 300 has a correlation with the substantial insulating property of the protective film 300.

(c) In the electron supply layer forming step S120, the electron supply layer 160 is formed so that the surface force A of the electron supply layer 160 satisfies the above-described predetermined characteristics. Thereby, it is possible to stably manufacture the nitride semiconductor laminate 10 capable of suppressing the decrease of the drain current over time when the semiconductor device 20 is driven.

(d) In the electron supply layer forming step S120, the cooling rate when lowering the temperature of the substrate 100 from the growth temperature of the electron supply layer 160 is 1.0° C./s or more. Thereby, it is possible to form the electron supply layer 160 so that the surface force A of the electron supply layer 160 satisfies the above-described predetermined characteristic. It can be considered that this is because by setting the cooling rate to be higher than the predetermined value, for example, a surface state (dangling bond, surface charge, etc.) of the electron supply layer 160 is affected.

(e) When the temperature of the substrate 100 is lowered from the growth temperature of the electron supply layer 160, $H_2$ gas or He gas may be supplied as a cooling gas to the surface of the electron supply layer 160. Since $H_2$ gas or He gas having a large specific heat is supplied to the surface of the electron supply layer 160, it is possible to improve cooling efficiency of the surface of the electron supply layer 160. Thereby, it is possible to form the electron supply layer 160 so that the surface force A of the electron supply layer 160 satisfies the above-described predetermined characteristic, as in the case that the cooling rate at the time of lowering the temperature of the substrate 100 from the growth temperature of the electron supply layer 160 is a predetermined value or more as described above.

(f) As the inspecting step S130 of inspecting the nitride semiconductor laminate 10, the surface force measuring step S132 of measuring a surface force A of the electron supply layer 160 acting between a probe 450 and the surface of the electron supply layer 160 by using a predetermined probe 450, and the selecting step S134 of selecting the nitride semiconductor laminate 10 based on the surface force A of the electron supply layer 160, are performed. Thereby, it is possible to exclude the nitride semiconductor laminate 10 in which the drain current is decreased over time when the semiconductor device 20 is driven, and possible to non-destructively select the nitride semiconductor laminate 10 capable of suppressing the decrease of the drain current over time, before manufacturing the semiconductor device 20. In this way, it is possible to predict the long-term reliability of the semiconductor device 20 at the stage of manufacturing the nitride semiconductor laminate 10 and to manage the quality of the nitride semiconductor laminate 10.

<Other Embodiments>

As described above, the embodiments of the present invention have been specifically described. However, the present invention is not limited to the above-described embodiments, and various modifications can be made without departing from the gist of the invention.

In the above-described embodiment, explanation is given for a case that the substrate 100 is configured as a SiC substrate. However, the substrate 100 may be configured as a GaN substrate (GaN freestanding substrate), a sapphire substrate, or a diamond substrate.

In the above-described embodiment, explanation is given for a case that the substrate 100 has a semi-insulating property. However, the substrate may have conductivity. In this case, it is preferable that the nitride semiconductor laminate has a configuration as in the following modified example.

Figure 8:
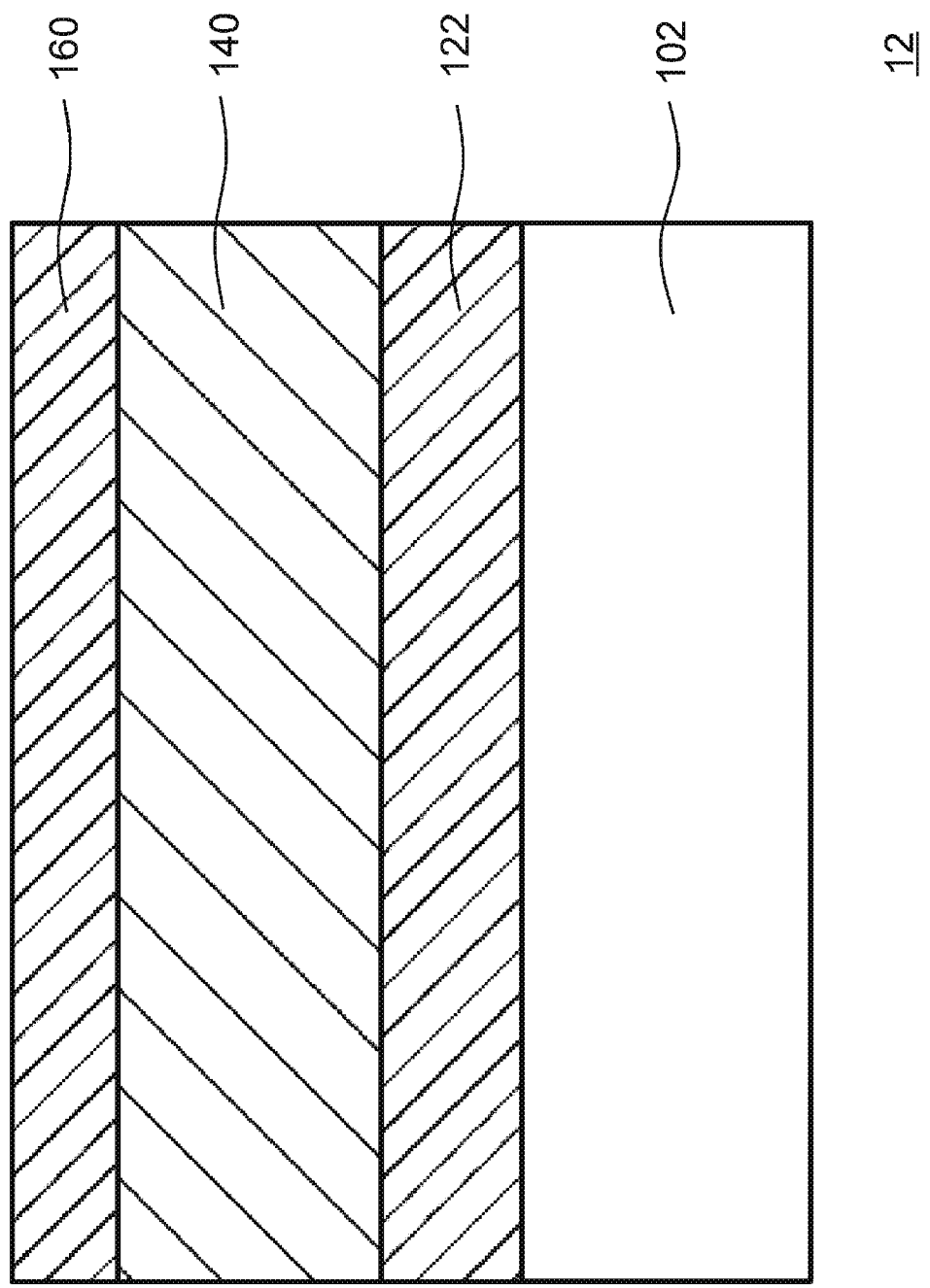
FIG. 8 is a cross-sectional view showing a nitride semiconductor laminate of a modified example according to an embodiment of the present invention.

Here, FIG. 8 is a cross-sectional view showing a nitride semiconductor laminate of a modified example according to an embodiment of the present invention.

In the nitride semiconductor laminate 12 shown in FIG. 8, the substrate 102 has conductivity. The substrate 102 is configured as, for example, an n-type GaN freestanding substrate. A semi-insulating layer 122 is provided on the substrate 102. The specific resistance of the semi-insulating layer 122 is, for example, $10^5$ Ω·cm or more. The semi-insulating layer 122 contains, for example, a semi-insulating group nitride semiconductor as a main component and contains a transition metal such as iron (Fe). Thereby, the above-described predetermined specific resistance can be realized in the semi-insulating layer 122. The electron transit layer 140 and the electron supply layer 160 similar to those in the above-described embodiment are sequentially provided on the semi-insulating layer 122.

According to the modified example, since the semi-insulating layer 122 is provided between the substrate 102 and the electron transit layer 140, it is possible to suppress diffusion of free electrons from the electron transit layer 140 to the substrate 102 and suppress the leakage current.

In the above described embodiment, explanation is given for a case that the nucleation layer contains AlN. However, the nucleation layer may contain the group III nitride semiconductor other than AlN, and for example may contain a group III nitride semiconductor such as GaN, AlGaN, InN, InGaN, AlInGaN or the like, that is, a group III nitride semiconductor represented by a composition formula of $Al_xIn_yGa_{1-x-y}N$ (0≤x+y≤1).

In the above-described embodiment, explanation is given for a case that the electron transit layer 140 contains AlGaN. However, the electron transit layer 140 may contain a group III nitride semiconductor other than GaN, and for example, it may contain a group III nitride semiconductor such as AlGaN, InN, InGaN, AlInGaN, that is, a group III nitride semiconductor represented by a composition formula of $Al_xIn_yGa_{1-x-y}N$ (0≤x+y≤1).

In the above-described embodiment, explanation is given for a case that the electron supply layer 160 contains AlGaN. However, the electron supply layer 160 may contain a group III nitride semiconductor other than AlGaN, as long as it has a wider band gap than the group III nitride semiconductor constituting the electron transit layer 140 and a lattice constant smaller than the lattice constant of the electron transit layer 140. Specifically, the electron supply layer 160 may contain, for example, a group III nitride semiconductor such as AlInGaN, that is, a group III nitride semiconductor represented by a composition formula of $Al_xIn_yGa_{1-x-y}N$ ($0 \leq x+y \leq 1$).

In the above-described embodiment, explanation is given for a case that the nitride semiconductor laminate 10 is manufactured using the MOVPE apparatus. However, the nitride semiconductor laminate 10 may be manufactured using a hydride vapor phase growth apparatus (HVPE apparatus).

In the above-describe embodiment, explanation is given for a case that the electron supply layer 160 is formed so that the surface force A of the electron supply layer 160 satisfies the above-described predetermined characteristic, by adjusting the cooling condition, etc., when lowering the temperature of the substrate 100 from the growth temperature of the electron supply layer 160. However, as described below, after forming the electron supply layer 160, the surface of the electron supply layer 160 may be modified so that the surface force A of the electron supply layer 160 satisfies the above-described predetermined characteristic.

Specifically, for example, a predetermined plasma treatment may be performed to the surface of the electron supply layer 160 after the electron supply layer forming step S120. As a method of the plasma treatment, for example, inductively coupled plasma reactive ion etching (ICP-RIE) method can be used. In the case of using the ICP-RIE method, it can be performed, for example, under conditions of antenna power 100 W, bias power 5 W, argon (Ar) flow rate 20 sccm, 0.8 Pa, and 1 minute. Thereby it is possible to modify the surface of the electron supply layer 160 so that the surface force A of the electron supply layer 160 satisfies the above-described predetermined characteristic.

Further, for example, the surface of the electron supply layer 160 may be subjected to UV ozone treatment after the electron supply layer forming step S120. In this case, for example, UV ozone treatment can be performed for 30 minutes. Even in this case, it is possible to modify the surface of the electron supply layer 160 so that the surface force A of the electron supply layer 160 satisfies the predetermined characteristic.

Further, for example, ion implantation of hydrogen ions ($H^+$) may be performed to the surface of the electron supply layer 160 after the electron supply layer forming step S120. In this case, the ion implantation can be performed for example under a condition that an acceleration voltage is 1 MeV, and a dose is $10^{13}$ ion/cm$^2$. By this condition, hydrogen ions are implanted only in the outermost surface of the electron supply layer 160. Even in this case, it is possible to modify the surface of the electron supply layer 160 so that the surface force A of the electron supply layer 160 satisfies the above-described predetermined characteristic.

In the above-described embodiment, explanation is given for a case that the inspecting step S130 including the surface force measuring step S132 and the selecting step S134, is performed to the nitride semiconductor laminate 10 containing the group III nitride semiconductor. However, the above-described inspecting step can be performed as long as the semiconductor laminate has the configuration of HEMT, even in a case of a semiconductor laminate containing a semiconductor other than the group III nitride semiconductor (for example, gallium arsenide (GaAs) or the like). Namely, it is possible to predict the long-term reliability of the semiconductor device at the manufacturing stage of manufacturing the semiconductor laminate and manage the quality of the semiconductor laminate, even in a case of the semiconductor laminate containing semiconductors other than the group III nitride semiconductors.

EXAMPLE

Various experimental results which support the effect of the present invention will be described hereafter.

(1) Manufacturing of the Semiconductor Device

As described below, the semiconductor devices of comparative examples 1 and 2 and examples 1 and 2 were manufactured.

In comparative example 1, a semi-insulating SiC substrate of polytype 4H was used as a substrate. First, a nucleation layer containing AlN having a thickness of 200 nm was formed on the substrate 100. Then, an electron transit layer containing GaN having a thickness of 1200 nm was formed on the nucleation layer. Then, an electron supply layer containing $Al_{0.24}Ga_{0.76}N$ having a thickness of 20 nm was formed on the electron transit layer. At this time, the growth temperature of the electron supply layer was 1050° C. Further, a cooling rate when lowering the temperature of the substrate from the growth temperature of the electron supply layer was 0.9° C./s. Further, when lowering the temperature of the substrate from the growth temperature of the electron supply layer, only the $NH_3$ gas was supplied to the surface of the electron supply layer. Then, a source electrode and a drain electrode having a multilayer structure of Ti/Al/Ni/Au (20/50/20/200 nm) were formed on the electron supply layer. Further, a gate electrode having a multilayer structure of Ni/Au (20/200 nm) was formed on the electron supply layer. Note that a gate length was 2 μm, a gate width was 100 μm, a distance between the source electrode and the gate electrode was 2.5 μm, and a distance between the gate electrode and the drain electrode was 7.5 μm. Note that a protective film was not formed on the electron supply layer in order to accelerate a change of the drain current over time described later.

In comparative example 2, a semiconductor device was manufactured in the same manner as in comparative example 1 except that the growth temperature of the electron supply layer was 1000° C.

In example 1, the semiconductor device was manufactured in the same manner as in comparative example 1, except that the cooling rate in the electron supply layer forming step was about twice that in comparative example 1 (specifically, the cooling rate was 2.2° C./s).

In example 2, the semiconductor device was manufactured in the same manner as in comparative example 1, except that the $H_2$ gas was supplied in addition to the $NH_3$ gas when the temperature of the substrate was lowered from the growth temperature of the electron supply layer in the electron supply layer forming step.

(2) Evaluation (Measurement of the Surface Force)

After the electron supply layer forming step of each of comparative examples 1 and 2 and examples 1 and 2, the surface force A of the electron supply layer in each of comparative examples 1 and 2 and examples 1 and 2 was measured, using a surface force measuring equipment (ESP-5000) manufactured by Elionix Co. Specifically, in each of comparative examples 1 and 2 and examples 1 and 2, the surface force A of the electron supply layer acting as the attractive force to attract the surface of the electron supply layer and the probe was measured in a vacuum, using the probe consisting of a glass sphere (glass spherical material BK7, diameter 1 mm, surface roughness Ra 2 nm, Rz 11 nm)

covered with Cr. Under the same conditions, the surface force B of Pt was previously measured, and the absolute value |A−B| of the difference between the surface force A of the electron supply layer and the surface force B of Pt in each of comparative examples 1 and 2 and examples 1 and 2 was determined.

(Drive Test)

The semiconductor device of each of comparative examples 1 and 2 and examples 1 and 2 were driven, under the conditions that the temperature was 200° C., the voltage $V_{ds}$ between the source electrode and the drain electrode was 50V, and the voltage $V_{gs}$ between the gate electrode and the source electrode was −2V, and the change of the drain current $I_{ds}$ over time was measured. Then, in each of the semiconductor devices of comparative examples 1 and 2 and examples 1 and 2, the ratio $I_{ds}/I_{ds0}$ of the drain current $I_{ds}$ after elapse of a predetermined time with respect to an initial drain current $I_{ds0}$ was compared.

(3) Result

Figure 6A:
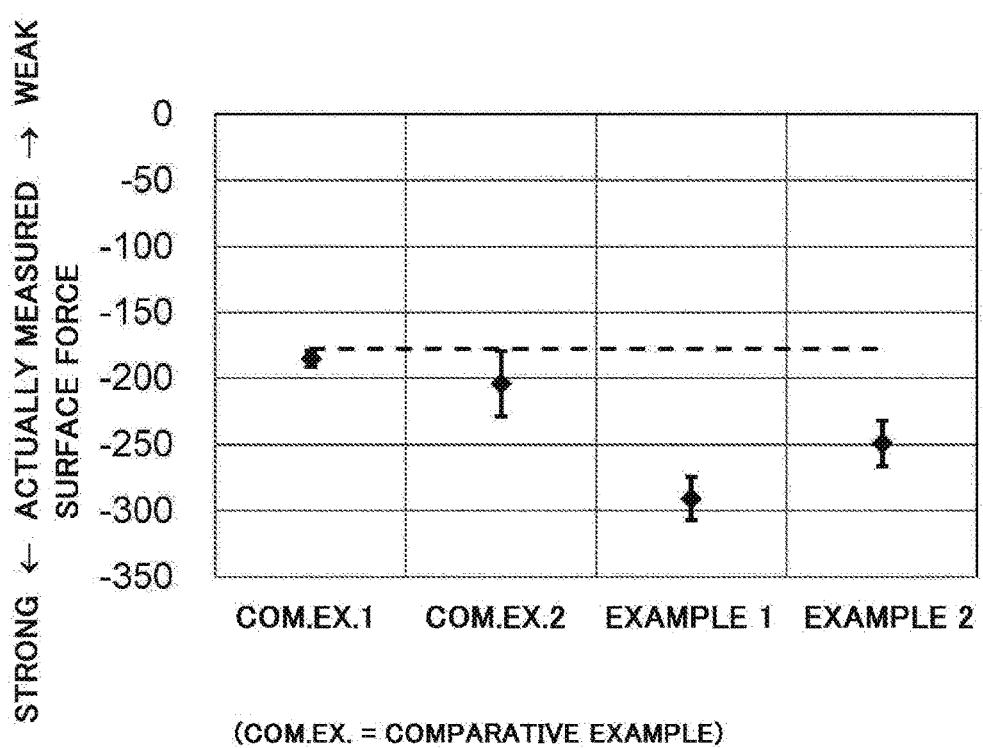
FIG. 6A is a view showing a surface force measurement result.

FIG. 6A is a view showing a surface force measurement result. FIG. 6A shows an actually measured value of the surface force A of the electron supply layer in each of comparative examples 1 and 2 and examples 1 and 2. Since the actually measured value of the surface force A of the electron supply layer is the attractive force as described above, it is a negative value. Therefore, the smaller the value of the surface force A is, the stronger the surface force A is. Further, the broken line in FIG. 6A shows the surface force B of Pt.

As shown in FIG. 6A, the surface force A of the electron supply layer in each of comparative examples 1 and 2 and examples 1 and 2 was stronger (smaller) than the surface force B of Pt. The surface force A of the electron supply layer in each of examples 1 and 2 was stronger (smaller) than the surface force A of the electron supply layer in each of comparative examples 1 and 2. From this fact, it was confirmed that the surface force A of the electron supply layer could be improved by adjusting the cooling conditions at the time of lowering the temperature of the substrate from the growth temperature of the electron supply layer in the electron supply layer forming step as in examples 1 and 2.

Figure 6B:
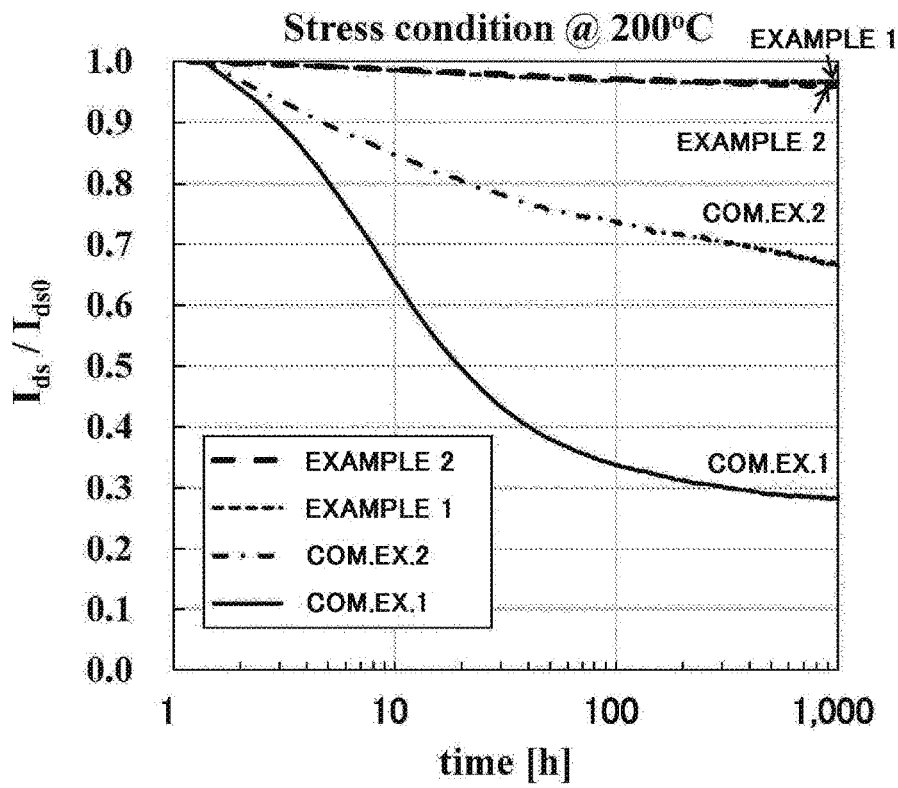
FIG. 6B is a view showing a result of a drive test of a semiconductor device.

FIG. 6B is a view showing a result of a drive test of the semiconductor device. In FIG. 6B, a horizontal axis represents time, and a vertical axis represents the ratio $I_{ds}/I_{ds0}$ of the drain current $I_{ds}$ after elapse of a predetermined time with respect to the initial drain current $I_{ds0}$.

As shown in FIG. 6B, in each of the semiconductor devices of comparative examples 1 and 2, the drain current $I_{ds}$ was greatly decreased over time. In contrast, it was confirmed that the decrease of the drain current $I_{ds}$ over time was suppressed in each of the semiconductor devices of examples 1 and 2. It can be considered that this is because in examples 1 to 2, accumulation of the negative charge over time in the vicinity of the surface of the electron supply layer could be suppressed, and the concentration of the two-dimensional electron gas in the electron transit layer could be maintained at a predetermined concentration, by improving the surface force A of the electron supply layer.

Here, Table 1 shows the absolute value |A−B| of the difference between the surface force A of the electron supply layer and the surface force B of Pt, and the ratio $I_{ds}/I_{ds0}$ of the drain current $I_{ds}$ after 1000 hours with respect to the initial drain current $I_{ds0}$ (also simply referred to as "drain current ratio" hereafter).

TABLE 1

| | Comparative example 1 | Comparative example 2 | Example 1 | Example 2 |
|---|---|---|---|---|
| Absolute value \| A − B \| of difference in surface force [μN] | 7.5 | 26.3 | 112.9 | 71.3 |
| $I_{ds}/I_{ds0}$ | 0.28 | 0.67 | 0.97 | 0.96 |

Figure 7:
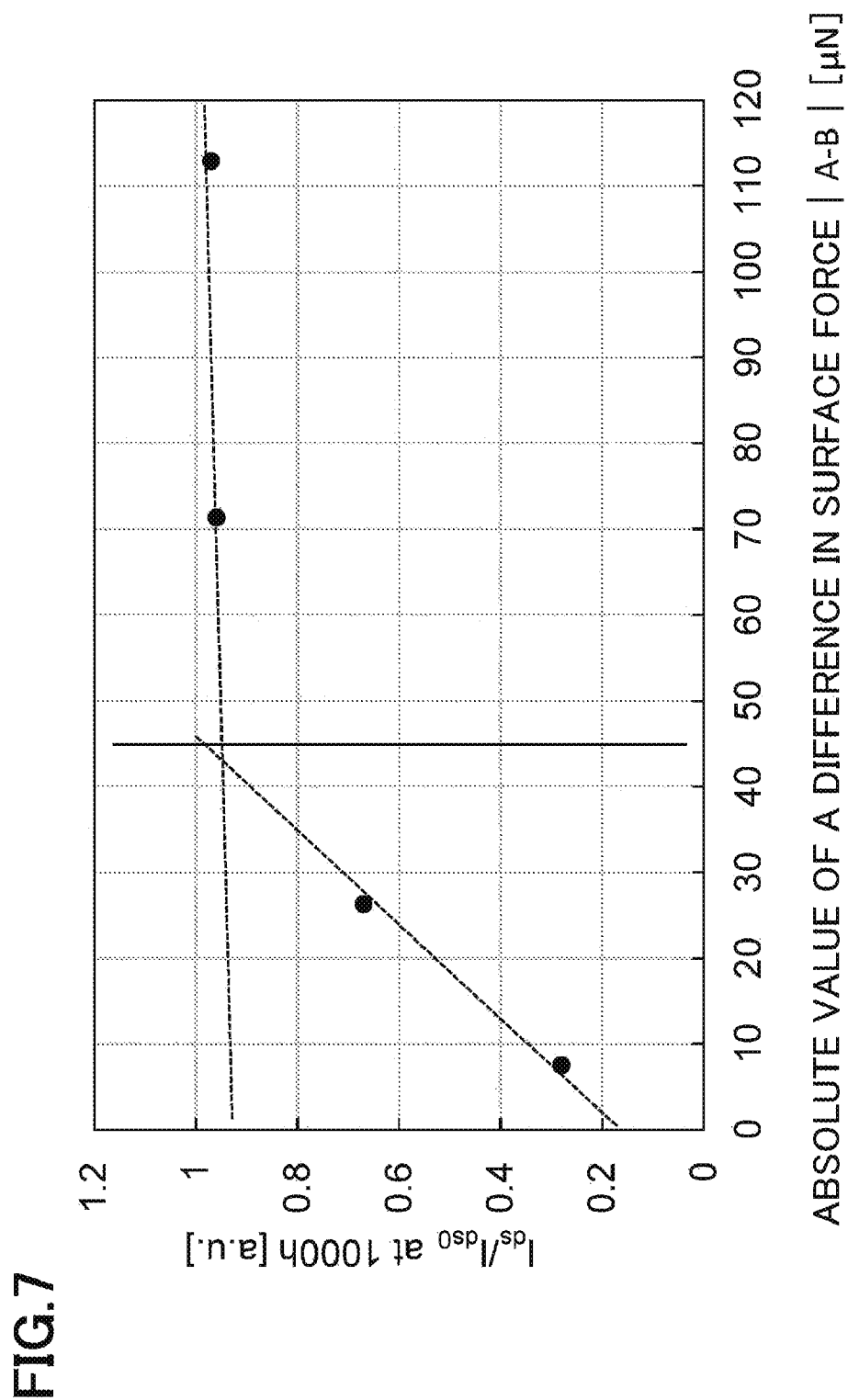
FIG. 7 is a view showing a drain current ratio to an absolute value of a difference in surface force.

Further, FIG. 7 is a view showing a ratio of drain current ratio with respect to an absolute value of a difference in surface force.

As shown in FIG. 7, it was confirmed that as the absolute value |A−B| of the difference between the surface force A of the electron supply layer and the surface force B of Pt was increased (as the surface force A of the electron supply layer was strong), the drain current ratio $I_{ds}/I_{ds0}$ was monotonically increased. Further, it was confirmed that by setting the absolute value |A−B| of the difference in surface force to 30 μN or more, the drain current ratio $I_{ds}/I_{ds0}$ could be made 0.70 or more.

Further, it was confirmed that in the region where the absolute value |A−B| of the difference in surface force was less than 45 μN, the gradient of the drain current ratio $I_{ds}/I_{ds0}$ with respect to the absolute value |A−B| of the difference in surface force was large. Meanwhile, it was confirmed that in the region where the absolute value |A−B| of the difference in surface force was 45 μN or more, the gradient of the drain current ratio $I_{ds}/I_{ds0}$ becomes gentle and the drain current ratio $I_{ds}/I_{ds0}$ was maintained at a value close to 1. Namely, it was confirmed that by setting the absolute value |A−B| of the difference in surface force to 45 μN or more, the drain current ratio $I_{ds}/I_{ds0}$ could be remarkably improved. Specifically, it was confirmed that by setting the absolute value |A−B| of the difference in surface force to 45 μN or more, the drain current ratio $I_{ds}/I_{ds0}$ could be made 0.90 or more.

As described above, it was confirmed that according to examples 1 to 2, the long-term reliability of the semiconductor device could be improved.

<Preferable Aspects of the Present Invention>

Preferable aspects of the present invention will be supplementarily described hereafter.

(Supplementary Description 1)

A nitride semiconductor laminate, including:
a substrate;
an electron transit layer provided on the substrate and containing a group III nitride semiconductor; and
an electron supply layer provided on the electron transit layer and containing a group III nitride semiconductor,
wherein a surface force A of the electron supply layer acting as an attractive force for attracting a probe and a surface of the electron supply layer when measured using the probe consisting of a glass sphere with a diameter of 1 mm covered with Cr, is stronger than a surface force B of Pt when measured under the same condition, and an absolute value |A−B| of a difference between them is 30 μN or more.

(Supplementary Description 2)

The nitride semiconductor laminate according to supplementary description 1, wherein an absolute value |A−B| of the difference between the surface force of the electron supply layer and the surface force of Pt is 45 μN or more.

(Supplementary Description 3)

A method for manufacturing a nitride semiconductor laminate, including:

forming an electron transit layer containing a group III nitride semiconductor on a substrate; and forming an electron supply layer containing a group III nitride semiconductor on the electron transit layer, wherein in forming the electron supply layer, the electron supply layer is formed so that a surface force A of the electron supply layer acting as an attractive force for attracting a probe and a surface of the electron supply layer when measured using the probe consisting of a glass sphere with a diameter of 1 mm covered with Cr, is stronger than a surface force B of Pt when measured under the same condition, and an absolute value |A−B| of a difference between them is 30 µN or more.

(Supplementary Description 4)

There is provided the method for manufacturing a nitride semiconductor laminate according to supplementary description 3, wherein in forming the electron supply layer, a cooling rate at the time of lowering a temperature of the substrate from a growth temperature of the electron supply layer is 1.0° C./s or more.

(Supplementary Description 5)

There is provided the method for manufacturing a nitride semiconductor laminate according to supplementary description 4, wherein in forming the electron supply layer, the cooling rate is 1.5° C./s or more.

(Supplementary Description 6)

There is provided the method for manufacturing a nitride semiconductor laminate according to any one of supplementary descriptions 3 to 5, wherein in forming the electron supply layer, hydrogen gas or helium gas is supplied to a surface of the electron supply layer, when the temperature of the substrate is lowered from the growth temperature of the electron supply layer.

(Supplementary Description 7)

A method for manufacturing a nitride semiconductor laminate, including:

forming an electron transit layer containing a group III nitride semiconductor on a substrate;

forming the electron supply layer containing a group III nitride semiconductor on the electron transit layer; and modifying a surface of the electron supply layer, wherein in modifying the surface of the electron supply layer, the surface of the electron supply layer is modified so that a surface force A of the electron supply layer acting as an attractive force for attracting a probe and a surface of the electron supply layer when measured using the probe consisting of a glass sphere with a diameter of 1 mm covered with Cr, is stronger than a surface force B of Pt when measured under the same condition, and an absolute value |A−B| of a difference between them is 30 µN or more.

(Supplementary Description 8)

The method for manufacturing a nitride semiconductor laminate according to supplementary description 7, wherein in modifying the surface of the electron supply layer, predetermined plasma treatment, UV ozone treatment, or ion implantation of hydrogen ions is applied to the surface of the electron supply layer.

(Supplementary Description 9)

A method for manufacturing a nitride semiconductor laminate, including:

forming an electron transit layer containing a group III nitride semiconductor on a substrate; and forming an electron supply layer containing a group III nitride semiconductor on the electron transit layer, wherein in forming the electron supply layer, a cooling rate at the time of lowering a temperature of the substrate from a growth temperature of the electron supply layer is 1.0° C./s or more.

(Supplementary Description 10)

A method for manufacturing a nitride semiconductor laminate, including:

forming an electron transit layer containing a group III nitride semiconductor on a substrate; and forming an electron supply layer containing a group III nitride semiconductor on the electron transit layer, wherein in forming the electron supply layer, hydrogen gas or helium gas is supplied to a surface of the electron supply layer, when lowering a temperature of the substrate from a growth temperature of the electron supply layer.

(Supplementary Description 11)

A method for manufacturing a nitride semiconductor laminate, including:

forming an electron transit layer containing a group III nitride semiconductor on a substrate;

forming an electron supply layer containing a group III nitride semiconductor on the electron transit layer; and modifying a surface of the electron supply layer, wherein in modifying the surface of the electron supply layer, predetermined plasma treatment, UV ozone treatment, or ion implantation of hydrogen ions is applied to the surface of the electron supply layer.

(Supplementary Description 12)

A method for manufacturing a semiconductor laminate, including:

sequentially forming an electron transit layer and an electron supply layer on a substrate, thereby forming a semiconductor laminate having the electron transit layer and the electron supply layer;

measuring a surface force of the electron supply layer acting between a probe and a surface of the electron supply layer by using a predetermined probe; and selecting the semiconductor laminate based on the surface force of the electron supply layer.

(Supplementary Description 13)

The method for manufacturing a semiconductor laminate according to supplementary description 12, wherein in forming the semiconductor laminate, the electron transit layer and the electron supply layer are each made of a group III nitride semiconductor, and in measuring the surface force of the electron supply layer, measuring a surface force A of the electron supply layer acting as an attractive force for attracting the probe and a surface of the electron supply layer by using the probe consisting of a glass sphere with a diameter of 1 mm covered with Cr; and in selecting the semiconductor laminate, the semiconductor laminate is selected, in which the surface force A of the electron supply layer is stronger than a surface force B of Pt when measured under the same condition, and an absolute value of a difference between them|A−B| is 30µ or more.

(Supplementary Description 14)

A method for inspecting a semiconductor laminate, for inspecting a semiconductor laminate in which an electron transit layer and an electron supply layer are sequentially provided on a substrate, the method including:

measuring a surface force of the electron supply layer acting between a probe and a surface of the electron supply layer by using a predetermined probe; and selecting the semiconductor laminate based on the surface force of the electron supply layer.

(Supplementary Description 15)

A semiconductor device, including:

a substrate;

an electron transit layer provided on the substrate and containing a group III nitride semiconductor;

an electron supply layer provided on the electron transit layer and containing a group III nitride semiconductor; and a gate electrode, a source electrode and a drain electrode provided on the electron supply layer, wherein a ratio of a drain current after 1000 hours with respect to an initial drain current is 0.70 or more, when driven under conditions that a temperature is 200° C., a voltage between the source electrode and the drain electrode is 50 V, and a voltage between the gate electrode and the source electrode is −2 V.

(Supplementary Description 16)

The semiconductor device according to supplementary description 15, wherein a surface force A of the electron supply layer acting as an attractive force for attracting a probe and a surface of the electron supply layer when measured using the probe consisting of a glass sphere with a diameter of 1 mm covered with Cr, is stronger than a surface force B of Pt when measured under the same condition, and an absolute value |A−B| of a difference between them is 30 μN or more.

(Supplementary Description 17)

The semiconductor device according to supplementary description 15, wherein the ratio of the drain current is 0.90 or more.

(Supplementary Description 18)

The semiconductor device according to supplementary description 17, wherein a surface force A of the electron supply layer acting as the attractive force for attracting a probe and the surface of the electron supply layer when measured using the probe consisting of a glass sphere with a diameter of 1 mm covered with Cr, is stronger than a surface force B of Pt when measured under the same condition, and ab absolute value |A−B| of a difference between them is 45 μN or more.

What is claimed is:

1. A nitride semiconductor laminate, comprising:

a substrate;

an electron transit layer provided on the substrate and containing a first group III nitride semiconductor; and an electron supply layer provided on the electron transit layer and containing a second group III nitride semiconductor having a bandgap wider than a bandgap of the first group III nitride semiconductor, wherein a surface force A of the electron supply layer acting as an attractive force for attracting a probe and a surface of the electron supply layer when measured using the probe consisting of a glass sphere with a diameter of 1 mm covered with Cr, is stronger than a surface force B of platinum when measured under the same condition, and an absolute value |A−B| of a difference between them is 30 μN or more.

2. The nitride semiconductor laminate according to claim 1, wherein an absolute value |A−B| of the difference between the surface force of the electron supply layer and the surface force of platinum is 45 μN or more.

3. The nitride semiconductor laminate according to claim 1, wherein the absolute value |A−B| of the difference between the surface force A of the electron supply layer and the surface force B of platinum is 120 μN or less.

4. A method for manufacturing a nitride semiconductor laminate, comprising:

forming an electron transit layer containing a first group III nitride semiconductor on a substrate; and forming an electron supply layer containing a second group III nitride semiconductor having a bandgap wider than a bandgap of the first group III nitride semiconductor on the electron transit layer, wherein in forming the electron supply layer, the electron supply layer is formed so that a surface force A of the electron supply layer acting as an attractive force for attracting a probe and a surface of the electron supply layer when measured using the probe consisting of a glass sphere with a diameter of 1 mm covered with Cr, is stronger than a surface force B of platinum when measured under the same condition, and an absolute value |A−B| of a difference between them is 30 μN or more.

5. The method for manufacturing a nitride semiconductor laminate according to claim 4, wherein in forming the electron supply layer, a cooling rate at the time of lowering a temperature of the substrate from a growth temperature of the electron supply layer is 1.0° C./s or more.

6. The method for manufacturing a nitride semiconductor laminate according to claim 5, wherein in forming the electron supply layer, the cooling rate is 1.5° C./s or more.

7. The method for manufacturing a nitride semiconductor laminate according to claim 4, wherein in forming the electron supply layer, hydrogen gas or helium gas is supplied to a surface of the electron supply layer, when the temperature of the substrate is lowered from the growth temperature of the electron supply layer.

8. The method for manufacturing a nitride semiconductor laminate according to claim 4, wherein in forming the electron supply layer, the electron supply layer is formed so that the absolute value |A−B| of the difference between the surface force A of the electron supply layer and the surface force B of platinum is 120 μN or less.

9. A method for manufacturing a nitride semiconductor laminate, comprising:

forming an electron transit layer containing a first group III nitride semiconductor on a substrate;

forming the electron supply layer containing a second group III nitride semiconductor having a bandgap wider than a bandgap of the first group III nitride semiconductor on the electron transit layer; and modifying a surface of the electron supply layer, wherein in modifying the surface of the electron supply layer, the surface of the electron supply layer is modified so that a surface force A of the electron supply layer acting as an attractive force for attracting a probe and a surface of the electron supply layer when measured using the probe consisting of a glass sphere with a diameter of 1 mm covered with Cr, is stronger than a surface force B of platinum when measured under the same condition, and an absolute value |A−B| of a difference between them is 30 μN or more.

10. The method for manufacturing a nitride semiconductor laminate according to claim 9, wherein in modifying the surface of the electron supply layer, predetermined plasma treatment, UV ozone treatment, or ion implantation of hydrogen ions is applied to the surface of the electron supply layer.

11. The method for manufacturing a nitride semiconductor laminate according to claim 9, wherein in modifying the surface of the electron supply layer, the surface of the electron supply layer is modified so that the absolute value

|A−B| of the difference between the surface force A of the electron supply layer and the surface force B of platinum is 120 μN or less.

12. A method for manufacturing a semiconductor laminate, comprising:

sequentially forming an electron transit layer and an electron supply layer on a substrate, thereby forming a semiconductor laminate having the electron transit layer and the electron supply layer;

measuring a surface force of the electron supply layer acting between a probe and a surface of the electron supply layer by using a probe; and selecting the semiconductor laminate based on the surface force of the electron supply layer, wherein in forming the semiconductor laminate, the electron transit layer contains a first group III nitride semiconductor, and the electron supply layer contains a second group III nitride semiconductor having a bandgap wider than a bandgap of the first group III nitride semiconductor, and in measuring the surface force of the electron supply layer, measuring a surface force A of the electron supply layer acting as an attractive force for attracting the probe and a surface of the electron supply layer by using the probe consisting of a glass sphere with a diameter of 1 mm covered with Cr; and in selecting the semiconductor laminate, the semiconductor laminate is selected, in which the surface force A of the electron supply layer is stronger than a surface force B of platinum when measured under the same condition, and an absolute value |A−B| of a difference between them is 30 μN or more.

13. The method for manufacturing a semiconductor laminate according to claim 12, wherein in selecting the semiconductor laminate, the semiconductor laminate is selected, in which the absolute value |A−B| of the difference between the surface force A of the electron supply layer and the surface force B of platinum is 120 μN or less.

14. The method for manufacturing a semiconductor laminate according to claim 12, wherein in measuring the surface force of the electron supply layer, the probe comprises a glass sphere.

* * * * *

UNITED STATES PATENT AND TRADEMARK OFFICE
CERTIFICATE OF CORRECTION

PATENT NO. : 11,508,629 B2
APPLICATION NO. : 16/312496
DATED : November 22, 2022
INVENTOR(S) : Fumimasa Horikiri It is certified that error appears in the above-identified patent and that said Letters Patent is hereby corrected as shown below:

In the Specification

Column 8, Line 64, "160, 112 gas or helium" should read -- 160, $H_2$ gas or helium --

Column 16, Line 60, "measuring equipment (ESP-5000)" should read -- measuring equipment (ESF-5000) --

Column 20, Line 57, "them |A-B| is 30μ or more." should read -- them |A-B| is 30μN or more. --

Signed and Sealed this
Twenty-first Day of November, 2023

Katherine Kelly Vidal
*Director of the United States Patent and Trademark Office*